United States Patent
Komatsu

(10) Patent No.: US 8,362,367 B2
(45) Date of Patent: Jan. 29, 2013

(54) MULTILAYER PRINTED WIRING BOARD AND METHOD FOR MANUFACTURING MULTILAYER PRINTED WIRING BOARD

(75) Inventor: Daiki Komatsu, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 515 days.

(21) Appl. No.: 12/566,742

(22) Filed: Sep. 25, 2009

(65) Prior Publication Data

US 2010/0078212 A1   Apr. 1, 2010

Related U.S. Application Data

(60) Provisional application No. 61/100,871, filed on Sep. 29, 2008.

(51) Int. Cl.
*H05K 1/11*   (2006.01)
(52) U.S. Cl. ..................................... 174/262
(58) Field of Classification Search ............. 174/262, 174/250, 251, 257, 258, 260, 266, 267; 361/748, 361/783
See application file for complete search history.

(56) References Cited

U.S. PATENT DOCUMENTS

2009/0050359 A1 * 2/2009 Hu et al. ................... 174/262

FOREIGN PATENT DOCUMENTS

| JP | 11-150356 | 6/1999 |
|---|---|---|
| JP | 2001-326466 | 11/2001 |
| JP | 2003-179353 | 6/2003 |
| JP | 2003-332716 | 11/2003 |
| JP | 2005-347391 | 12/2005 |

* cited by examiner

*Primary Examiner* — Jeremy Norris
*Assistant Examiner* — Tremesha S Willis
(74) *Attorney, Agent, or Firm* — Oblon, Spivak, McClelland, Maier & Neustadt, L.L.P.

(57) ABSTRACT

A method for manufacturing a multilayer printed wiring board suitable for forming fine conductive circuits. A multilayer printed wiring board is formed with a first insulative material and a first conductive circuit formed on the first insulative material. A second insulative material is formed on the first insulative material and the first conductive circuit, and has an opening portion that reaches the first conductive circuit. A second conductive circuit is formed on the second insulative material and a via conductor is formed in the opening portion and connecting the first conductive circuit and the second conductive circuit. An insulative thin film is formed on at least part of the side surface of the first conductive circuit, and the via conductor is directly connected to the surface of the first conductive circuit exposed through the opening portion.

13 Claims, 5 Drawing Sheets

MULTILAYER PRINTED WIRING BOARD AND METHOD FOR MANUFACTURING MULTILAYER PRINTED WIRING BOARD

CROSS-REFERENCE TO RELATED APPLICATIONS

The present application claims the benefits of priority to U.S. application Ser. No. 61/100,871, filed Sep. 29, 2008. The contents of that application are incorporated herein by reference in their entirety.

BACKGROUND OF THE INVENTION

1. Technical Field

The present invention is related to a multilayer printed wiring board suitable for forming fine conductive circuits and to a method for manufacturing such a multilayer printed wiring board.

2. Description of Related Art

A multilayer printed wiring board is formed by alternately laminating conductive circuits and interlayer insulation layers. In interlayer insulation layers, through-holes are formed; and lower-layer conductive circuits and upper-layer conductive circuits are electrically connected through so-called via conductors formed by plating the through-holes.

In recent years, highly dense and highly reliable multilayer printed wiring boards have been required as electronic devices become more compact and signal transmission speeds increase according to developments in the electronics industry. As for a method for forming wiring in such multilayer printed wiring boards, for example, the semi-additive method disclosed in Japanese Patent Laid-Open Publication 2003-179353 is provided. The contents of this publication are incorporated herein by reference in their entirety.

BRIEF SUMMARY OF EMBODIMENTS OF THE INVENTION

DISCLOSURE OF THE INVENTION

However, in the structure disclosed in JP 2003-179353, when through-holes were filled by plating, it was necessary to increase the thickness of the plating resist and conductive circuits. Therefore, it was sometimes difficult to form fine conductive patterns.

Also, by reducing the pitch of conductive wiring, the metal that forms the conductive wiring occasionally becomes dispersed in the interlayer insulation layer. As a result, electrochemical migration (also known as ion migration) may occur, causing short circuiting between electrodes due to lowered insulation, may occur.

The present invention was carried out considering the above problems. Its objective is to provide a multilayer printed wiring board suitable for forming fine conductive circuits, and a method for manufacturing such a multilayer printed wiring board.

To achieve the above objective, a multilayer printed wiring board according to the first aspect of the present invention is characterized by the following: a first insulative material; a first conductive circuit formed on the first insulative material; a second insulative material formed on the first insulative material and the first conductive circuit, and having an opening portion that reaches the first conductive circuit; a second conductive circuit formed on the second insulative material; and a via conductor formed in the opening portion and connecting the first conductive circuit and the second conductive circuit. Here, an insulative thin film is formed on at least part of the surfaces, including the side surfaces, of the first conductive circuit, and the via conductor is directly connected to the surface of the first conductive circuit exposed through the opening portion.

It is also possible for an insulative thin film to be formed on the surfaces of the first insulative material and the second insulative material.

It is also possible for the first conductive circuit to be made up of an electroless plated film formed on the first insulative material and of an electrolytic plated film formed on the electroless plated film; and the via conductor is made up of an electroless plated film formed on the inner wall of the opening portion and on the surface of the first conductive circuit exposed through the opening portion, and of an electrolytic plated film formed on the electroless plated film.

It is also possible for the thickness of the insulative thin film to be set in the range of 5 nm to 1,000 nm.

It is also possible for the insulative thin film to be formed with at least either silicon nitride (SiN), silicon dioxide (SiO2), silicon oxynitride (SiON), silicon carbide (SiC), silicon oxycarbide (SiOC) or silicon oxyfluoride (SiOF).

To achieve the above objective, a method for manufacturing a multilayer printed wiring board according to the second aspect of the present invention is characterized by the following: a step to form a first conductive circuit on a first insulative material; a step to form a first insulative thin film on the first insulative material and the first conductive circuit; a step to form a second insulative material on the first insulative thin film; a step to form an opening portion in the second insulative material while removing the insulative thin film exposed through the opening portion; and a step to form a second conductive circuit on the second insulative material while forming in the opening portion a via conductor connecting the first conductive circuit and the second conductive circuit.

It is also possible for the method to have a step to form an insulative thin film on the second insulative material and the second conductive circuit.

It is also possible for the thickness of the insulative thin film to be set in the range of 5 nm to 1,000 nm.

It is also possible for the insulative thin film to be formed using a method such as sputtering, vacuum deposition or CVD.

According to the present invention, a multilayer printed wiring board with fine conductive circuits may be formed while preventing electrochemical migration.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

FIG. (1) is a cross-sectional view of a multilayer printed wiring board according to an embodiment of the present invention.

DETAILED DESCRIPTION OF THE EMBODIMENTS

Figure 1:
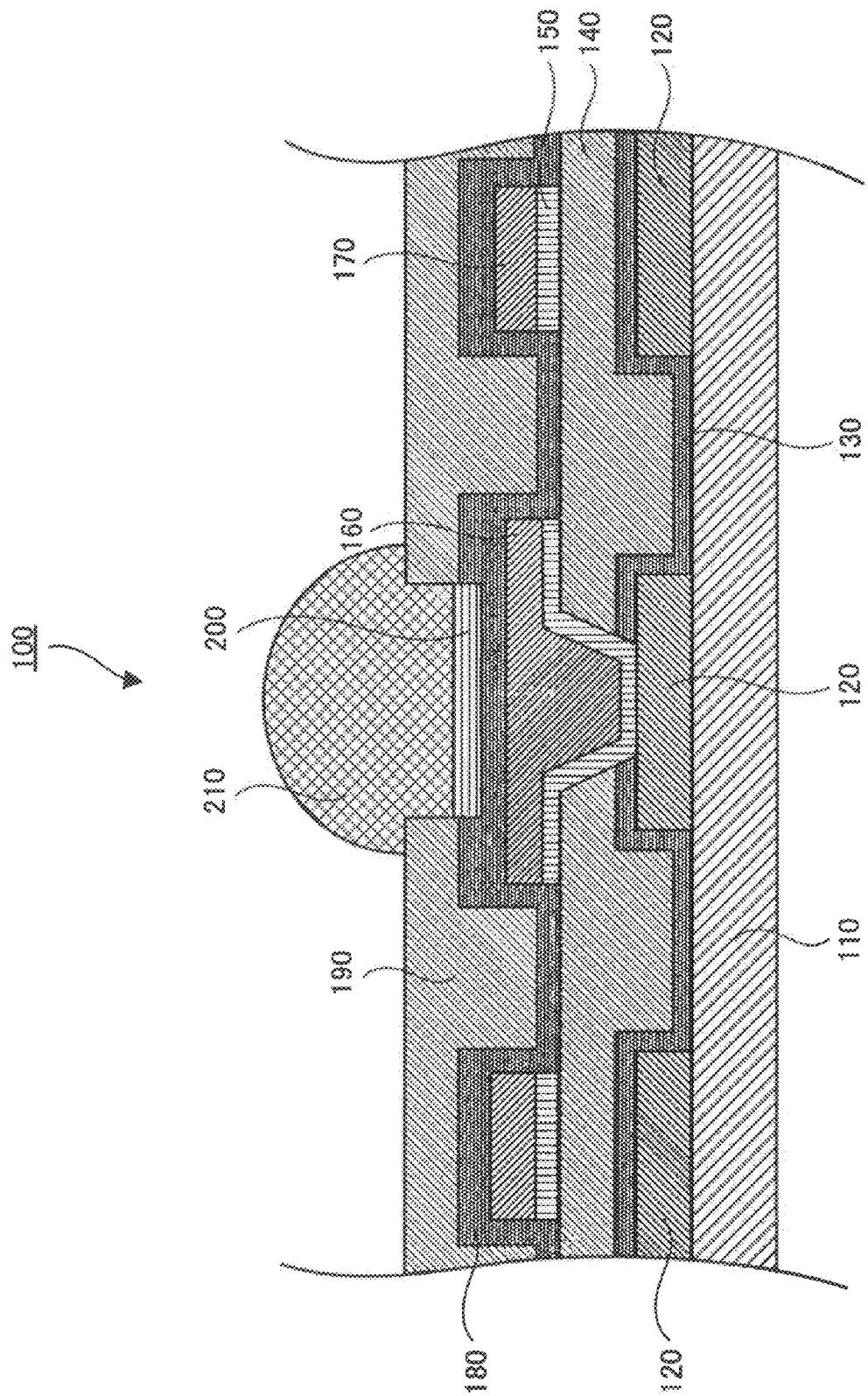

The embodiments will now be described with reference to the accompanying drawings, wherein like reference numerals designate corresponding or identical elements throughout the various drawings.

In the following, an embodiment of the multilayer printed wiring board according to the present invention is described. The embodiment is provided to make the principle of the present invention easily understood. However, the present invention is not limited to such, and other embodiments in which the structure of the present embodiment is appropriately substituted by a person skilled in the art may also be included in the scope of the present invention.

First, a multilayer printed wiring board is described, which is manufactured using a method for manufacturing a multilayer printed wiring board according to the present embodiment.

As shown in FIG. (1), multilayer printed wiring board (100) is formed with core substrate (110), first conductive circuit (120), first insulative thin film (130), first interlayer insulation layer (140), power-supply layer (150), via conductor (160) electrically connecting first conductive circuit (120) and second conductive circuit (170), second conductive circuit (170), second insulative thin film (180), solder-resist layer (second interlayer insulation layer) (190), soldering connection layer (200), solder bump (210) and so forth.

In multilayer printed wiring board (100), core substrate (110) is a base substrate on which to form conductive layers (such as first conductive circuit (120) and second conductive circuit (170)) and insulation layers (such as first interlayer insulation layer (140) and second interlayer insulation layer (190)). Also, it functions as a core material.

Core substrate (110) is made up of an insulation substrate and a conductive circuit formed on one surface or on both main surfaces of the insulation substrate. The insulation substrate is an insulative plate made by impregnating a base material such as glass fiber with epoxy resin or the like. Its thickness is set in the range of 60 μm to 600 μm.

When an insulation substrate or the like is formed on both main surfaces of core substrate (110), core substrate (110) is usually positioned at substantially the center in the direction of the height (thickness) of multilayer printed wiring board (100).

However, the number of layers laminated on both main surfaces of core substrate (110) may be different when structuring multilayer printed wiring board (100).

Also, first conductive circuits (120) may be formed on both main surfaces of core substrate (110) to be electrically connected by means of through-hole conductors. In FIG. (1), through-hole conductors are omitted.

First insulative thin film (130) is formed to cover the surface of core substrate (110) and first conductive circuit (120). Second insulative thin film (180) is formed to cover second conductive circuit (170) and first interlayer insulation layer (140). Insulative thin films (130, 180) are formed, for example, with silicon nitride (SiN), silicon dioxide (SiO2), silicon oxynitride (SiON), silicon carbide (SiC), silicon oxycarbide (SiOC) and/or silicon oxyfluoride (SiOF).

The thickness of insulative thin films (130, 180) is preferred to be set in the range of 5 nm to 1,000 nm; preferably, in the range of 20 nm to 300 nm, and further preferably in the range of 20 nm to 100 nm.

First insulative thin film (130) or the like prevents metals such as first conductive circuit (120) or the like made of copper, etc., from being dispersed in first interlayer insulation layer (140) or the like. As a result, the insulative performance of the insulation layers may be prevented from lowering, thus the occurrence of electrochemical migration is suppressed in which first conductive circuit (120) or the like becomes short-circuited.

In addition, since the insulative performance of first interlayer insulation layer (140) or the like is not required to be considered, such insulation layers may be made thinner.

Furthermore, by making first interlayer insulation layer (140) or the like thinner, stresses exerted on via conductors (160) may be reduced.

Also, even if the thickness of first interlayer insulation layer (140) is reduced, its surface is covered by an insulative thin film. Thus, when the interlayer insulation layer begins to expand due to, for example, heat generated in a semiconductor element, such thermal expansion of the interlayer insulation layer may be suppressed by the insulative thin film. Accordingly, warping in the multilayer printed wiring board may be suppressed.

First interlayer insulation layer (140) and second interlayer insulation layer (190) are formed, for example, with resin material including thermosetting resin and thermoplastic resin. As for such resin material, the following may be used: thermosetting resin (such as epoxy resin, imide resin, BT resin), thermoplastic resin (such as fluororesin, polyethylene terephthalate, polysulfone), or a compound of thermosetting resin and thermoplastic resin. The thickness of first interlayer insulation layer (140) or the like is set at 100 μm or less.

Second interlayer insulation layer (190) may also function as a solder resist layer. Solder resist layer (190) is formed, for example, with a liquid or dry-film photosensitive resist.

Power supply layer (150) contains, for example, either copper, titanium, titanium nitride or chrome. Forming power supply layer (150) is not limited to any specific method, but a method such as electroless plating, sputtering or the like may be listed.

Via conductor (160) is formed by filling copper plating in the opening portion which penetrates first interlayer insulation layer (140). First conductive circuit (120) and second conductive circuit (170) are electrically connected through via conductor (160).

Also, first insulative thin film (130) does not exist between via conductor (160) and first conductive circuit (120). Namely, power supply layer (150), which outlines via conductor (160), and first conductive circuit (120) are directly connected. Accordingly, electrical resistance between via conductor (160) and first conductive circuit (120) is effectively suppressed from increasing.

In solder resist layer (190), an opening portion reaching second conductive circuit (170) is formed. Then, in second conductive circuit (170), soldering connection layer (200) to enhance solderability is formed on the surface exposed through the opening portion. Furthermore, solder bump (210) is formed on soldering connection layer (200).

On multilayer printed wiring board (100), a semiconductor element such as an IC chip or the like is mounted via solder bump (210).

Next, a method for manufacturing multilayer printed wiring board (100) according to the above embodiment is described.

First, as shown in FIG. 2(*a*), first conductive circuit (120) is formed where a circuit pattern (core pattern) is formed on the surface of core substrate (110).

First conductive circuit (120) is formed through the following methods: by etching a copper-clad laminate; or by a method in which a welding-flux layer for electroless plating is formed on a substrate such as glass-epoxy substrate, polyimide substrate, ceramic substrate, metal substrate or the like, the surface of the welding-flux layer is roughened, and then electroless plating is performed; or by a semi-additive method; or the like.

In core substrate (110), by a well-known boring method using a drill or the like, penetrating holes may be formed, on which electroless copper plating and electrolytic copper plating are performed to form so-called through-holes. Conductive circuits on the front and back surfaces may be electrically connected via the through-holes. Also, resin may be filled in the through-holes and between conductors of conductive circuit (110) to ensure flatness.

Figure 2A:
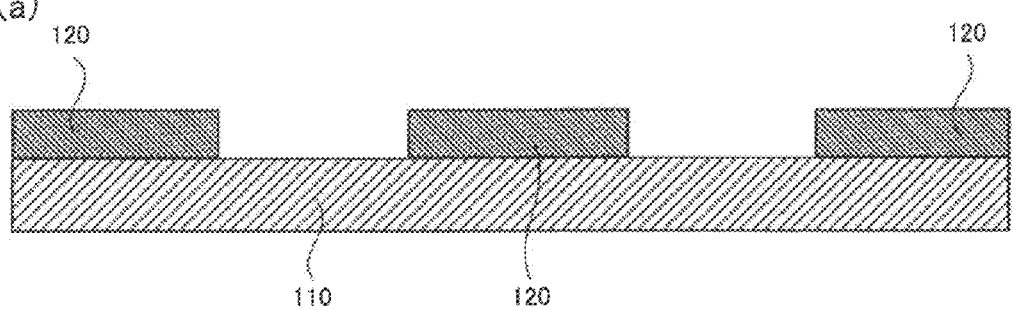
FIGS. 2(a), 2(b), 2c), 2(d), 2(e), 2(f), 2(g), 2(h), 2(i), 2(j) and 2(k) are cross-sectional views partially showing steps for manufacturing a multilayer printed wiring board according to the present invention.
Figure 2B:
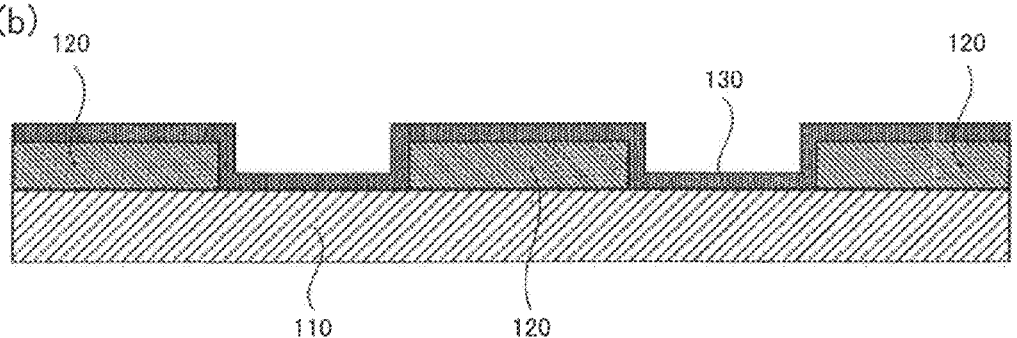

Next, as shown in FIG. 2(b), first insulative thin film (130) is formed to cover the surface of core substrate (110) and first conductive circuit (120) using a method such as sputtering, vacuum deposition or CVD.

For example, first insulative thin film (130) or the like is formed using sputtering equipment (type CFS-12P-100, made by Shibaura Mechatronics Corporation) under the following conditions: sputtering pressure of 0.3 Pa-0.9 Pa, sputtering power source of 1 kW-2 kW and argon flow rate of 20 sccm-80 sccm.

By covering first conductive circuit (120) with first insulative thin film (130), metal such as copper or the like which forms first conductive circuit (120) is prevented from being dispersed in first interlayer insulation layer (140). Also, that metal may be prevented from oxidizing.

Figure 2C:
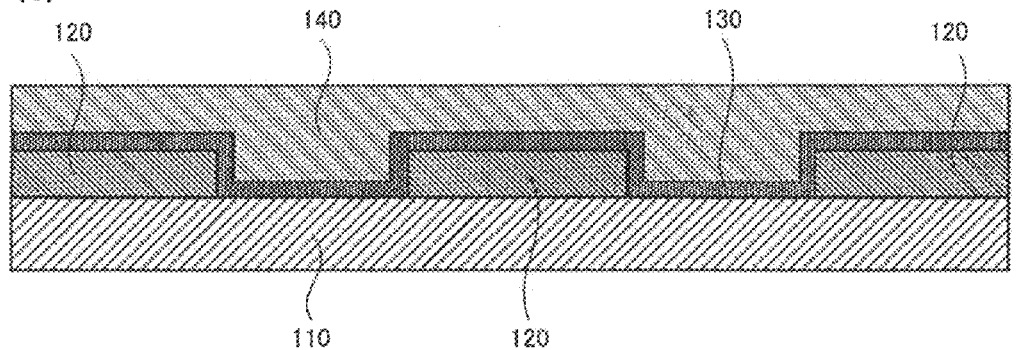

Next, as shown in FIG. 2(c), first interlayer insulation layer (140) is formed on first insulative thin film (130).

Resin insulation layer film "ABF" (made by Ajinomoto) is laminated on the substrate where an insulative thin film is formed under the following conditions: vacuum degree of 30 Pa-90 Pa, pressure of 0.2 MPa-0.6 MPa, temperature of 40°-120° and time of 30 sec.-90 sec. Then, the film is thermoset at approximately 170° for 30 minutes to form first interlayer insulation layer (140) or the like.

Figure 2D:
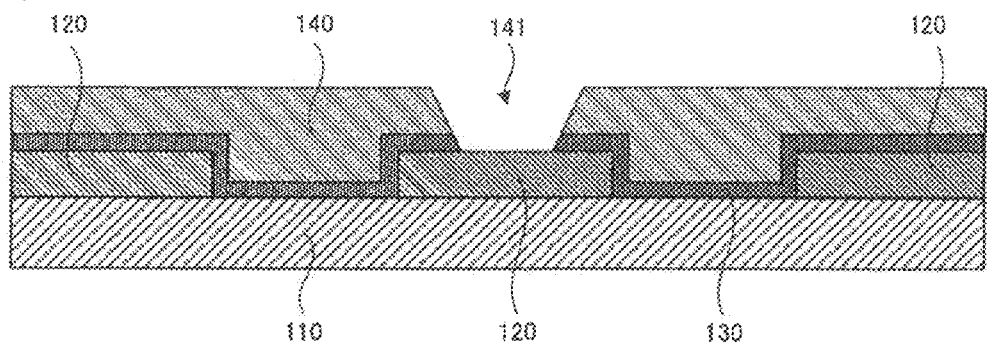

Next, as shown in FIG. 2(d), via hole (141) is formed in first interlayer insulation layer (140) using a carbon-dioxide gas ($CO_2$) laser, UV-YAG laser or the like. Via hole (141) is a through-hole (opening portion) with a diameter in the range of 10 μm to 150 μm.

Then, through laser processing, an opening portion is formed that makes via-hole (141) penetrating first interlayer insulation layer (140). Next, first insulative thin film (130) exposed through the opening portion is removed by reactive ion etching, for example. As a result, part of first conductive circuit (120) is exposed through the opening portion.

In the following, it is preferred that a treatment (desmear treatment) be conducted to remove residual smearing or the like remaining at the bottom of via-hole (141).

Figure 2E:
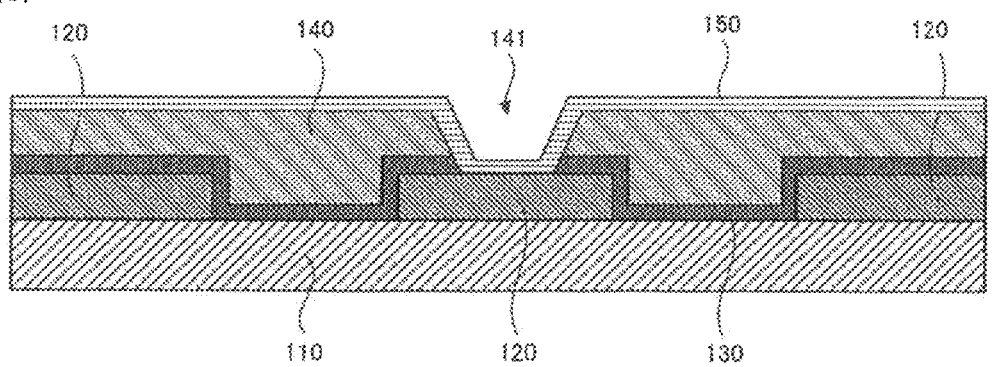

Next, as shown in FIG. 2(e), power supply layer (150) is formed on the surfaces of first conductive circuit (120), first interlayer insulation layer (140) and via-hole (141). Since power supply layer (150) is a metal conductor made of copper or the like, first conductive circuit (120) and via conductor (160) formed at a later step are electrically connected.

Figure 2F:
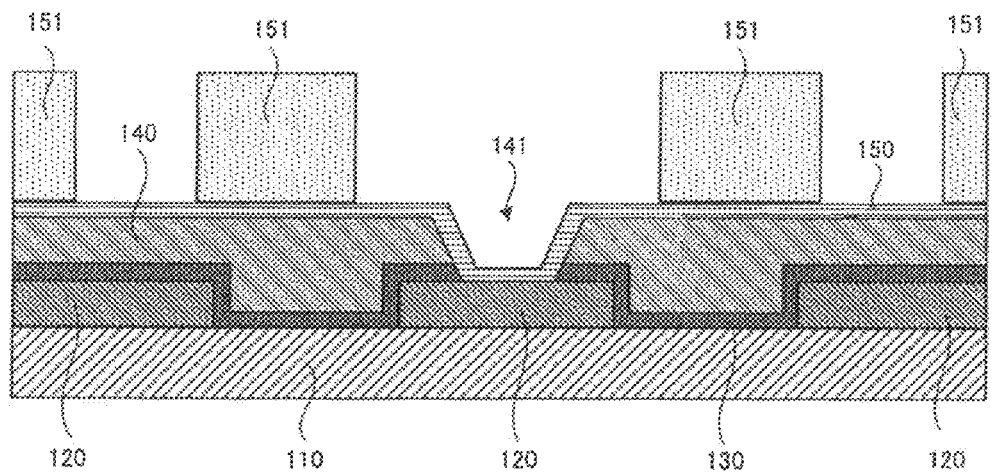

Next, as shown in FIG. 2(f), plating resist (151) is formed on power supply layer (150).

Figure 2G:
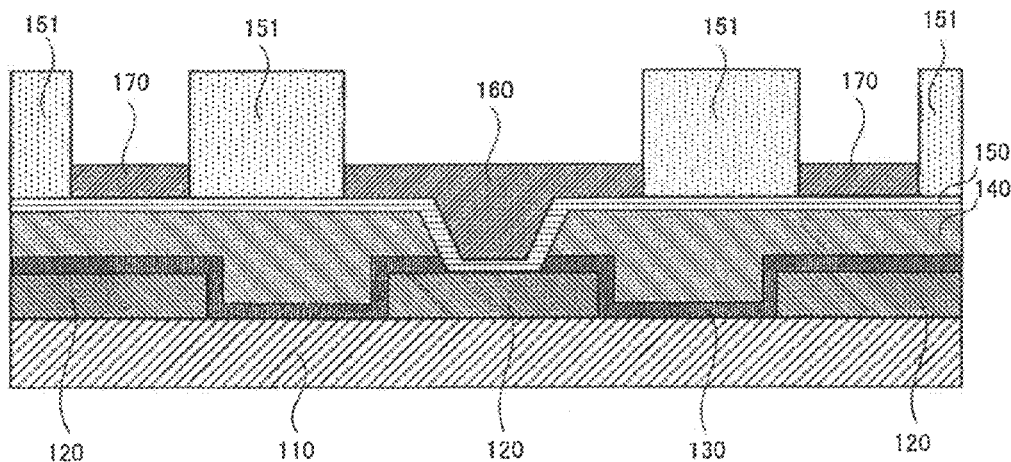

Next, as shown in FIG. 2(g), electrolytic plating is performed in the area where plating resist (151) is not formed so that via conductor (160) and second conductive circuit (170) are formed.

Figure 2H:
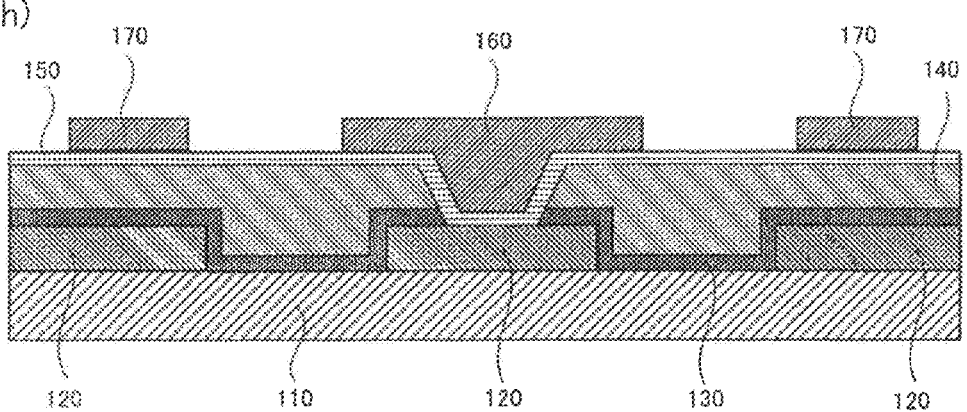
Figure 2I:
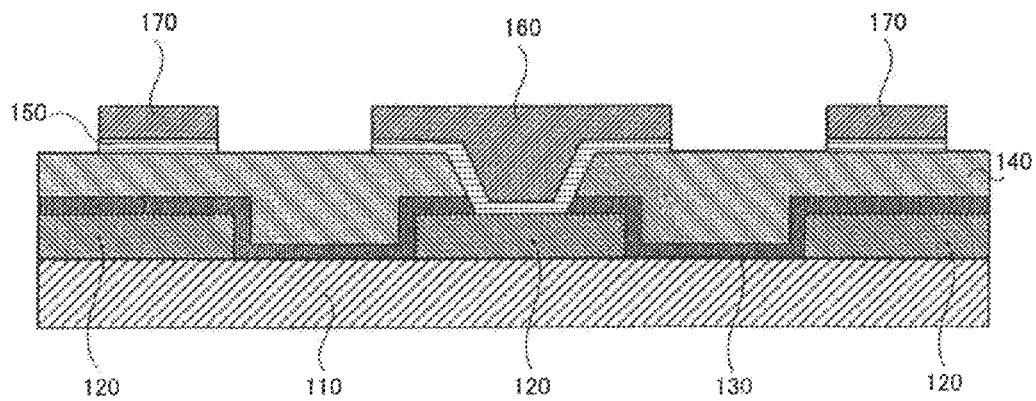

Next, as shown in FIG. 2(h), plating resist (151) is removed. Then, as shown in FIG. 2(i), using an etching solution containing sulfuric acid, hydrogen peroxide, sodium persulfate and so forth, power supply layer (150) beneath plating resist (151) is removed. Accordingly, independent via conductor (160) and second conductive circuit (170) are formed.

A treatment to roughen the surfaces of via conductor (160) and second conductive circuit (170) is appropriately conducted.

Figure 2J:
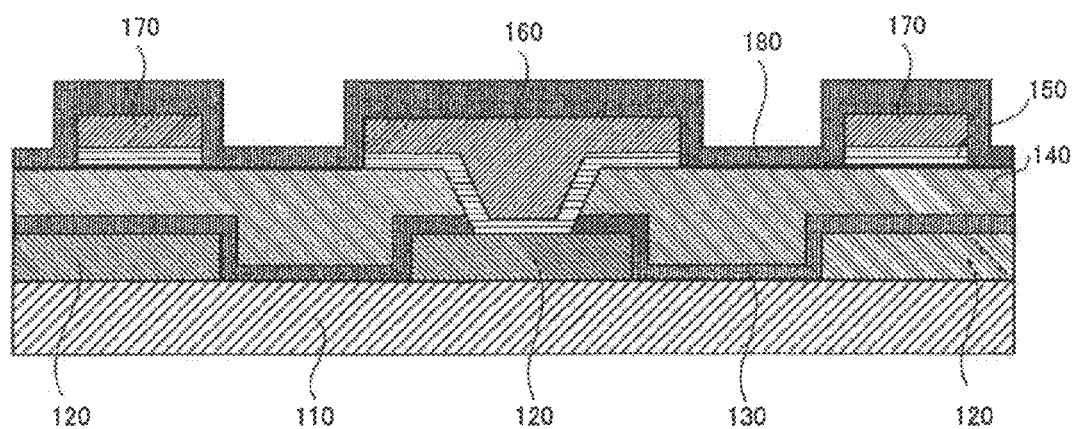

Next, as shown in FIG. 2(j), second insulative thin film (180) is formed to cover first interlayer insulation layer (140), via conductor (160) and second conductive circuit (170).

Figure 2K:
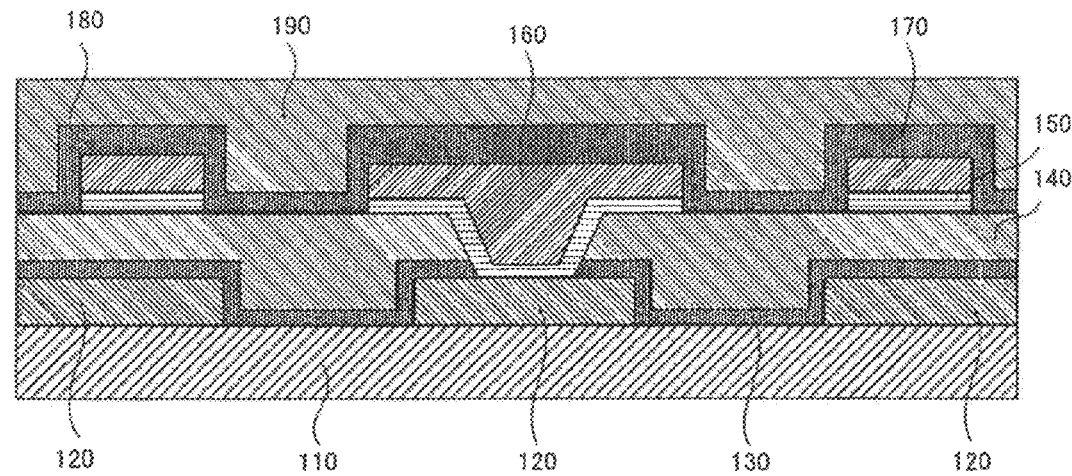

Next, as shown in FIG. 2(k), second interlayer insulation layer (190) is formed on the surface of second insulative thin film (180).

The above steps may further be repeated.

Lastly, solder-resist layer (190) is formed. Soldering connection layer (200) and solder bump (210) are formed in a through-hole portion (opening portion) drilled in solder resist layer (190). Accordingly, multilayer printed wiring board (100) is formed. On multilayer printed wiring board (100) formed as described, electronic components such as an IC chip are mounted via solder bump (210).

At each step, a general roughening treatment may be conducted according to requirements.

As described above, since an insulative thin film containing silicon nitride or the like covers the insulation layer, metal such as copper or the like may be suppressed from being dispersed in the interlayer insulation layer. Also, since the insulative thin film ensures insulation, the interlayer insulation layer may be made thinner. Furthermore, the insulative thin film does not exist between a via conductor and the first conductive circuit; instead, the via conductor and the first conductive circuit are directly connected. In doing so, an increase in electrical resistance between the via conductor and the first conductive circuit may be suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board, comprising:
   a first insulative material;
   a first conductive circuit formed on the first insulative material;
   an insulative thin film formed on a surface of the first conductive circuit, including side surfaces of the first conductive circuit, and not formed on a portion of the surface to which a via conductor is connected;
   a second insulative material formed on the first insulative material and the first conductive circuit such that the insulative thin film is interposed between the second insulative material and the first conductive circuit, the second insulative material having an opening portion that reaches the first conductive circuit such that a surface of the first conductive circuit is exposed through the opening portion;
   a second conductive circuit formed on the second insulative material, wherein the via conductor being formed in the opening portion and connecting the first conductive circuit and the second conductive circuit, such that the via conductor is directly connected to the surface of the first conductive circuit exposed through the opening portion;
   a soldering connection layer that is mechanically and electrically coupled to a surface of the second conductive circuit; and
   a solder bump formed on the soldering connection layer, wherein the solder bump is electrically coupled to the second conductive circuit.

2. The multilayer printed wiring board according to claim 1, wherein said insulative thin film is formed on a surface of the first insulative material, another insulative thin film being formed on the second insulative material.

3. The multilayer printed wiring board according to claim 1, wherein:
the first conductive circuit comprises an electroless plated film formed on the first insulative material and an electrolytic plated film formed on the electroless plated film, and
the via conductor comprises an electroless plated film formed on the inner wall of the opening portion and on the surface of the first conductive circuit exposed through the opening portion, and of an electrolytic plated film formed on the electroless plated film.

4. The multilayer printed wiring board according to claim 1, wherein the thickness of the insulative thin film is in the range of 5 nm to 1,000 nm.

5. The multilayer printed wiring board according to claim 1, wherein the insulative thin film is formed with at least either silicon nitride (SiN), silicon dioxide (SiO2), silicon oxynitride (SiON), silicon carbide (SiC), silicon oxycarbide (SiOC) or silicon oxyfluoride (SiOF).

6. A method for manufacturing a multilayer printed wiring board, comprising:
forming a first conductive circuit on a first insulative material;
forming a first insulative thin film on the first insulative material and a surface of the first conductive circuit except for a portion of the surface to which a via conductor is connected;
forming a second insulative material on the first insulative thin film and the first conductive circuit such that the insulative thin film is interposed between the second insulative material and the first conductive circuit;
forming an opening portion in the second insulative material and the insulative thin film such that a portion of the surface of the first conductive circuit is exposed through the opening portion;
forming a second conductive circuit on the second insulative material;
forming in the opening portion a via conductor connecting the first conductive circuit and the second conductive circuit;
forming a soldering connection layer that is mechanically and electrically coupled to a surface of the second conductive circuit; and
forming a solder bump on the soldering connection layer, wherein the solder bump is electrically coupled to the second conductive circuit.

7. The method for manufacturing a multilayer printed wiring board according to claim 6, further comprising forming an insulative thin film on the second insulative material and the second conductive circuit.

8. The method for manufacturing a multilayer printed wiring board according to claim 6, wherein the forming the insulative thin film comprises setting a thickness of the insulative thin film in the range of 5 nm to 1,000 nm.

9. The method for manufacturing a multilayer printed wiring board according to claim 6, wherein the forming the insulative thin film comprises using a method of sputtering, vacuum deposition or CVD.

10. The multilayer printed wiring board of claim 1, further comprising:
a soldering connection layer that is mechanically and electrically coupled to the surface of the second conductive circuit; and
a solder bump formed on the soldering connection layer, wherein the solder bump is electrically coupled to the second conductive circuit.

11. The method of claim 6, further comprising:
forming a soldering connection layer that is mechanically and electrically coupled to the surface of the second conductive circuit; and
forming a solder bump formed on the soldering connection layer, wherein the solder bump is electrically coupled to the second conductive circuit.

12. The multilayer printed wiring board according to claim 1, wherein the insulative thin film has a substantially uniform thickness and conforms to a profile of the first conductive circuit.

13. The method for manufacturing a multilayer printed wiring board according to claim 6, wherein said forming a first insulative thin film comprises forming the insulative thin film to have a substantially uniform thickness and to conform to a profile of the first conductive circuit.

* * * * *